(12) United States Patent
Toh et al.

(10) Patent No.: US 10,763,427 B2
(45) Date of Patent: Sep. 1, 2020

(54) HALL ELEMENT FOR 3-D SENSING AND METHOD FOR PRODUCING THE SAME

(71) Applicant: GLOBALFOUNDRIES Singapore Pte. Ltd., Singapore (SG)

(72) Inventors: Eng Huat Toh, Singapore (SG); Ruchil Kumar Jain, Singapore (SG); Yongshun Sun, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/243,801

(22) Filed: Jan. 9, 2019

(65) Prior Publication Data
US 2019/0148624 A1    May 16, 2019

Related U.S. Application Data

(62) Division of application No. 15/402,799, filed on Jan. 10, 2017, now Pat. No. 10,211,392.

(51) Int. Cl.
| H01L 43/06 | (2006.01) |
| H01L 43/14 | (2006.01) |
| G01R 33/07 | (2006.01) |
| H01L 43/04 | (2006.01) |

(52) U.S. Cl.
CPC .......... H01L 43/065 (2013.01); G01R 33/07 (2013.01); H01L 43/04 (2013.01); H01L 43/14 (2013.01)

(58) Field of Classification Search
CPC ....... H01L 43/065; H01L 43/04; H01L 43/14; G01R 33/07
See application file for complete search history.

(56) References Cited

U.S. PATENT DOCUMENTS

| 5,679,973 A * | 10/1997 | Mochizuki | H01L 43/06 257/421 |
| 2006/0097715 A1 | 5/2006 | Oohira et al. | |
| 2010/0164483 A1 | 7/2010 | Namai et al. | |
| 2017/0271399 A1* | 9/2017 | Lee | H01L 43/04 |

\* cited by examiner

*Primary Examiner* — Steven H Loke
*Assistant Examiner* — Juanita B Rhodes
(74) *Attorney, Agent, or Firm* — Ditthavong & Steiner P.C.

(57) ABSTRACT

A method of forming a 3D Hall effect sensor and the resulting device are provided. Embodiments include forming a p-type well in a substrate; forming a first n-type well in a first region surrounded by the p-type well in top view; forming a second n-type well in a second region surrounding the p-type well; implanting n-type dopant in the first and second n-type wells; and implanting p-type dopant in the p-type well and the first n-type well.

12 Claims, 7 Drawing Sheets

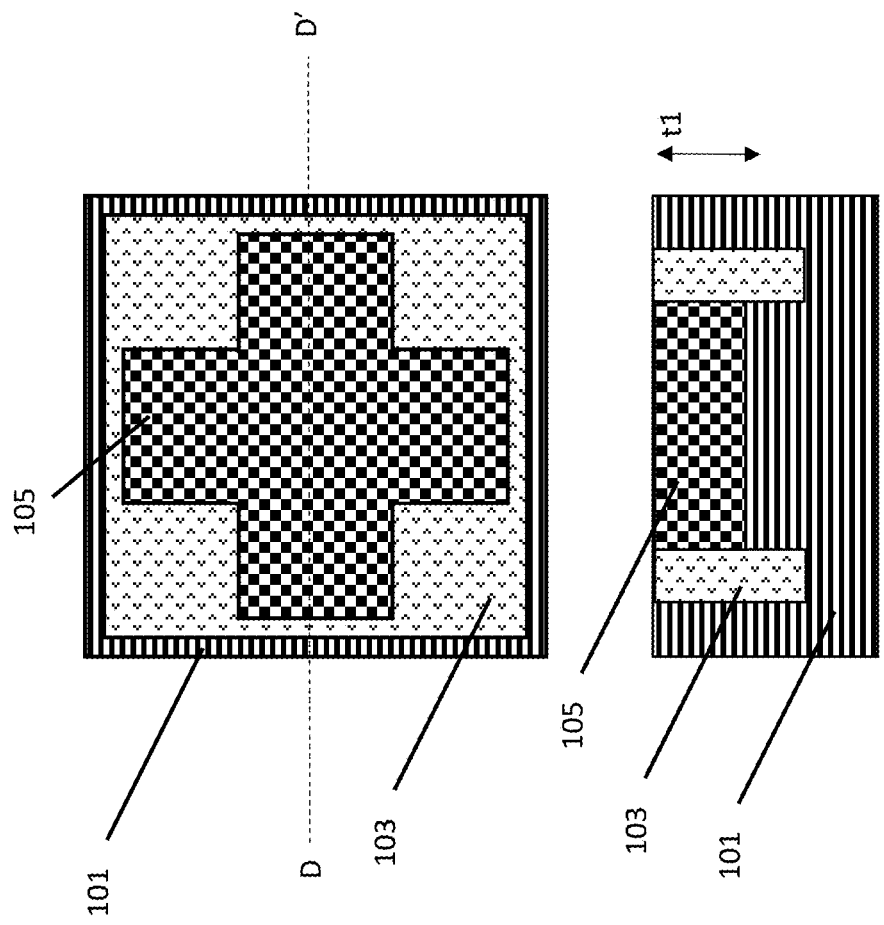

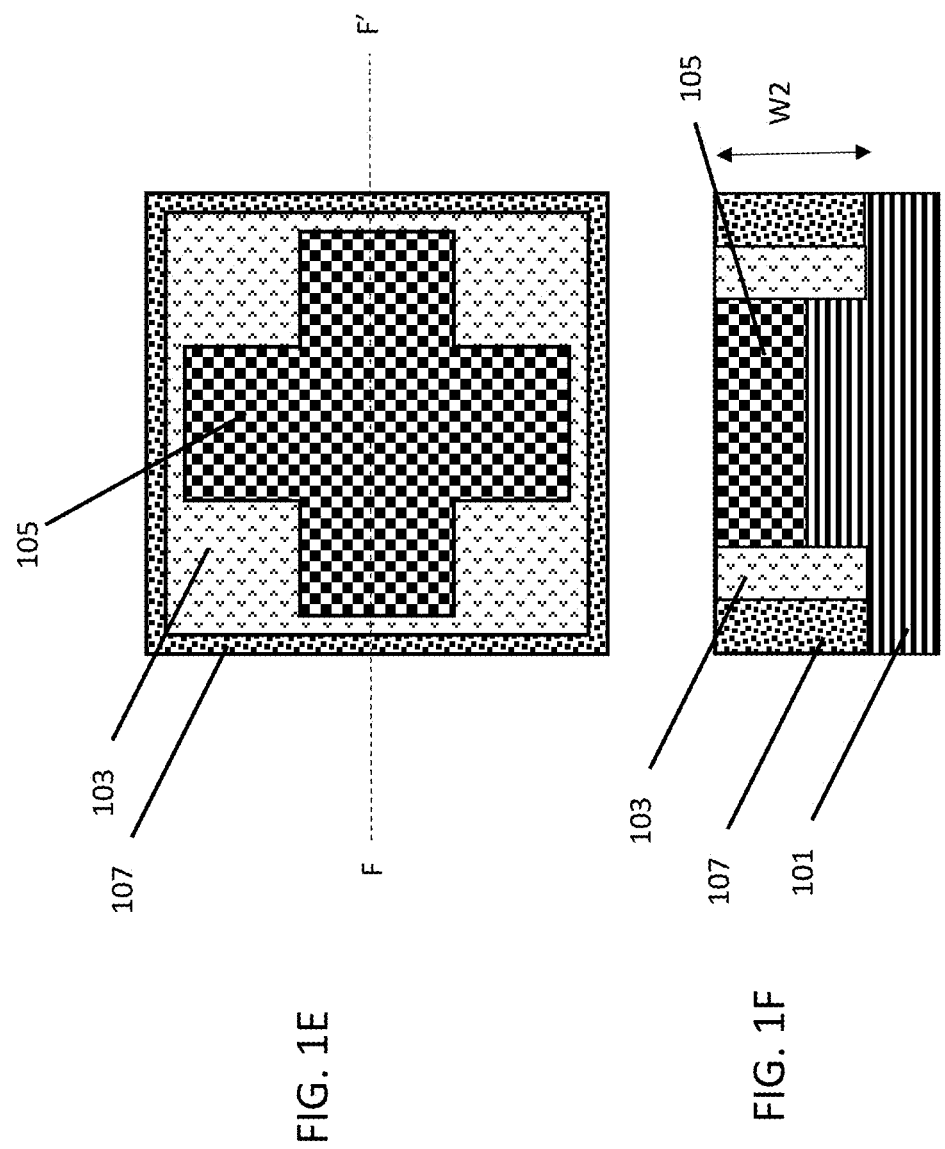

US 10,763,427 B2

HALL ELEMENT FOR 3-D SENSING AND METHOD FOR PRODUCING THE SAME

RELATED APPLICATION

The present application is a Divisional of application Ser. No. 15/402,799, filed on Jan. 10, 2017, which is incorporated herein by reference in its entirety.

TECHNICAL FIELD

The present disclosure relates to semiconductor fabrication. In particular, the present disclosure relates to hall elements integrated into semiconductor fabrication in advanced technology nodes.

BACKGROUND

The Hall effect is the production of a voltage difference (the Hall voltage) across an electrical conductor, transverse to an electric current in the conductor, and a magnetic field perpendicular to the current. When a current-carrying semiconductor is kept in a magnetic field, the charge carriers of the semiconductor experience a force in a direction perpendicular to both the magnetic field and the current. At equilibrium, a voltage appears at the semiconductor edges. The formula for the Hall coefficient becomes more complex in semiconductors where the carriers are generally both electrons and holes which may be present in different concentrations and have different mobilities.

Hall effect sensors are used as proximity sensors, slide-by switch sensors, wheel speed sensors, and brushless DC motor sensors in a variety of industries. Hall sensors are used in the automotive industry as magnetic sensors for position measurements. One-dimensional (1D) Hall effect sensors sense magnetic field perpendicular to the chip. Three-dimensional (3D) sensors are advantageous over 1D sensors, since fewer 3D sensors can be used, thereby saving space, time and cost. 3D Hall effect sensors are an improvement over 1D sensors since they sense a magnetic field both perpendicular and in-plane to the chip. 3-Axis Hall sensors are integrated 1D and two dimensional (2D) elements and assembled from six building blocks, thereby making the assembly process too complicated, and the resulting sensor is large. Further, with 3-Axis sensors, the magnetic field may not be sensed in one common region. For a multiple contact Hall sensor, each sensing terminal is a result or under the influence of at least two magnetic fields, which leads to cross interference. Moreover, with existing 3D Hall sensors, the employment of one n-type element makes it more difficult to design planar and vertical Hall elements for sensitivity optimization.

A need therefore exists for methodology enabling 3D Hall effect sensor integration in semiconductor fabrication to improve sensing and reduce cross-interference and the resulting devices.

SUMMARY

An aspect of the present disclosure is a Hall element for 3D sensing with reduced cross-interference and better design flexibility. Another aspect of the present disclosure is providing a Hall element for sensing in a single concentrated region with reduced interference with separate sensing for each magnetic field component. Yet another aspect of the present disclosure includes individual optimization of vertical and planar Hall elements. Further aspects include reducing doping or thickness of the vertical Hall element to significantly improve sensitivity, without affecting the planar Hall element. Another aspect of the present disclosure includes producing the Hall element with current tool and processes without any additional masks.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a p-type well in a substrate; forming a first n-type well in a first region surrounded by the p-type well in top view; forming a second n-type well in a second region surrounding the p-type well; implanting n-type dopant in the first and second n-type wells; and implanting p-type dopant in the p-type well and the first n-type well.

Aspects of the present disclosure include the substrate including a p-type substrate. Other aspects include forming the second n-type well in the second region as a frame-shaped pattern in top view. Other aspects include forming the first n-type well in the first region as a cross-shaped pattern in top view. Additional aspects include forming the p-type well to completely surround the cross-shaped n-type well. Further aspects include forming shallow trench isolation regions prior to forming the p-type well. Yet other aspects include forming the first or second n-type wells prior to forming the p-type well. Additional aspects include forming the first or second n-type wells after forming the p-type well. Other aspects include implanting n-type dopant and p-type dopant before n-type and p-type well formation. Another aspect includes implanting n-type dopant and p-type dopant after n-type and p-type well formation. Yet another aspect includes forming and patterning a nitride layer and to expose selected regions; performing self-aligned silicidation in the selected regions to reduce resistance in the n-type and p-type wells; and forming an interlayer dielectric (ILD) over the n-type and p-type wells; forming contacts in the ILD; and performing back-end-of-line (BEOL) processing.

Another aspect of the present disclosure is a device including a p-type well formed in a substrate; a first n-type well formed in a first region surrounded by the p-type well in top view; a second n-type well formed in a second region surrounding the p-type well; n-type dopant implanted in the first and second n-type wells; and p-type dopant implanted in the p-type well and the first n-type well, wherein the device is configured to sense a magnetic field perpendicular and in-plane direction relative to the device.

Aspects include the substrate including a p-type substrate. Other aspects include the second n-type well being formed in the second region having a frame-shaped pattern in top view. Additional aspects include the first n-type well being formed in the first region having a cross-shaped pattern in top view. Yet other aspects include the p-type well completely surrounding the cross-shaped n-type well. Further aspects include shallow trench isolation (STI) regions being adjacent to p-type well.

Yet another aspect of the present disclosure is a method including forming a p-type well in a p-type substrate; forming a first n-type well in a first region surrounded by the p-type well in top view, the first region having a crossed-shaped pattern in top view; forming a second n-type well in a second region surrounding the p-type well, the second region having a frame-shaped pattern in top view; implanting n-type dopant in the first and second n-type wells; and implanting p-type dopant in the p-type well and the first n-type well.

Aspects include forming and patterning a nitride layer and to expose selected regions; performing self-aligned silicidation in the selected regions to reduce resistance in the n-type and p-type wells; and forming an interlayer dielectric (ILD) over the n-type and p-type wells; forming contacts in the ILD; and performing BEOL processing.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A, 1C, 1E, and 1G schematically illustrate top views of a process flow to produce a 3D Hall effect sensor, in accordance with an exemplary embodiment;

FIGS. 1B, 1D, 1F, 1H and 1I schematically illustrate cross-sectional views of a process flow to produce a 3D Hall effect sensor, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limitations of 1D Hall elements attendant upon sensing magnetic field in a direction perpendicular to a semiconductor chip. In accordance with embodiments of the present disclosure, a 3D Hall element is provided which provides magnetic field sensing in both perpendicular and in-plane directions relative to the semiconductor chip.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figures 1A, 1B:
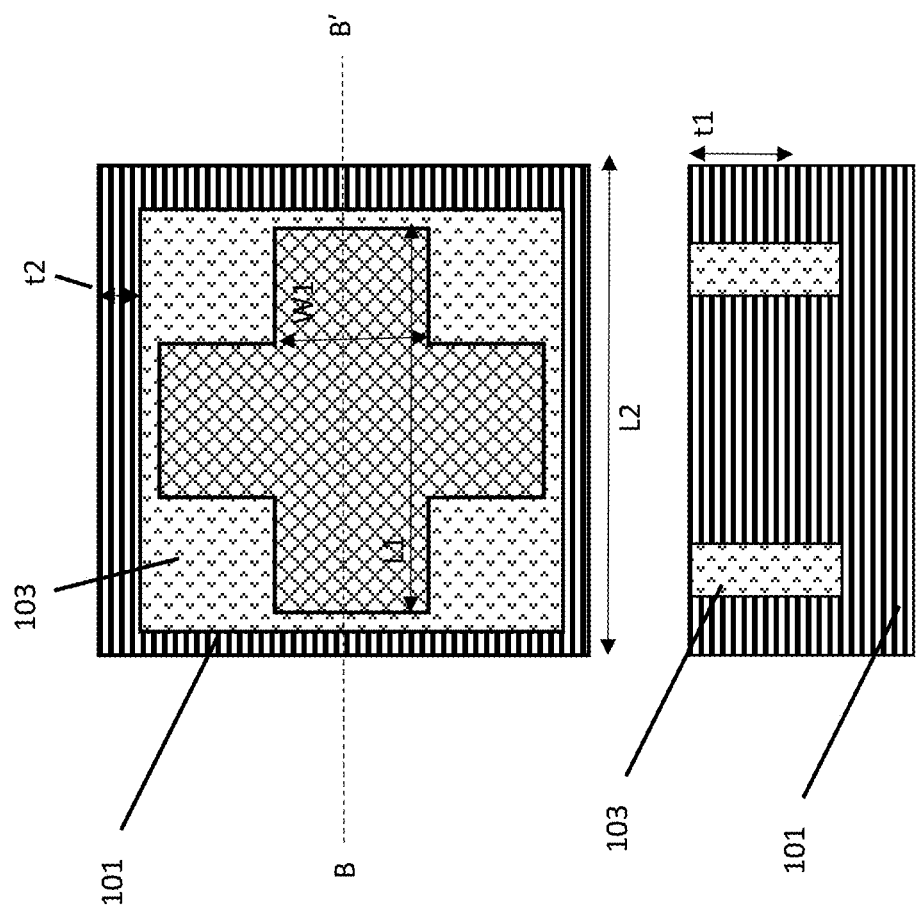

FIGS. 1A through 1I schematically illustrate a process flow for forming a 3-D Hall element, in accordance with an exemplary embodiment. Adverting to FIG. 1A, a substrate 101 is provided in top view. The substrate 101 can include a p-type substrate. Isolation structures, discussed further below, including STI regions are formed in the substrate 101. A p-type well 103 is formed in the substrate 101. FIG. 1B is a cross-sectional view of FIG. 1A along line 1B-1B'. Cross-sectional views 1B, 1D, 1F and 1H illustrate the formation of the planar Hall element.

In FIG. 1A, the dimensions of the 3D Hall element are as follows: bi-directional arrow L1 being 10-40 μm; bi-directional arrow L2 is 15-60 μm; bi-directional arrow W1 is 5-20 μm; bi-directional arrow t1 (thickness) is 0.5-2 μm (FIG. 1D); and bi-directional arrow t2 is 0.5-5 μm. In FIG. 1F, bi-directional arrow W2 is 0.5-5 μm. While specific examples are provided for this 3D Hall element, it should be apparent that these numbers will change for different technology and scaling and applications, and the range differences can be quite large.

A n-type well 105 is formed in a region surrounded by the p-type well 103 in the top view of FIG. 1C. The n-type well 105 is formed as a cross-shaped pattern in top view, and the p-type well 103 completely surrounds the cross-shaped n-type well 105. FIG. 1D is a cross-sectional view of FIG. 1C along line 1D-1D'. In FIG. 1E, a second n-type well 107 is formed in a region surrounding the p-type well 103 in the top view of FIG. 1E. The second n-type well 107 is formed as a frame-shaped pattern in top view. FIG. 1F is a cross-sectional view of FIG. 1E along line 1F-1F'. In certain examples, the second n-type well 107 can be the same as the n-type well 105.

Figures 1G, 1H:
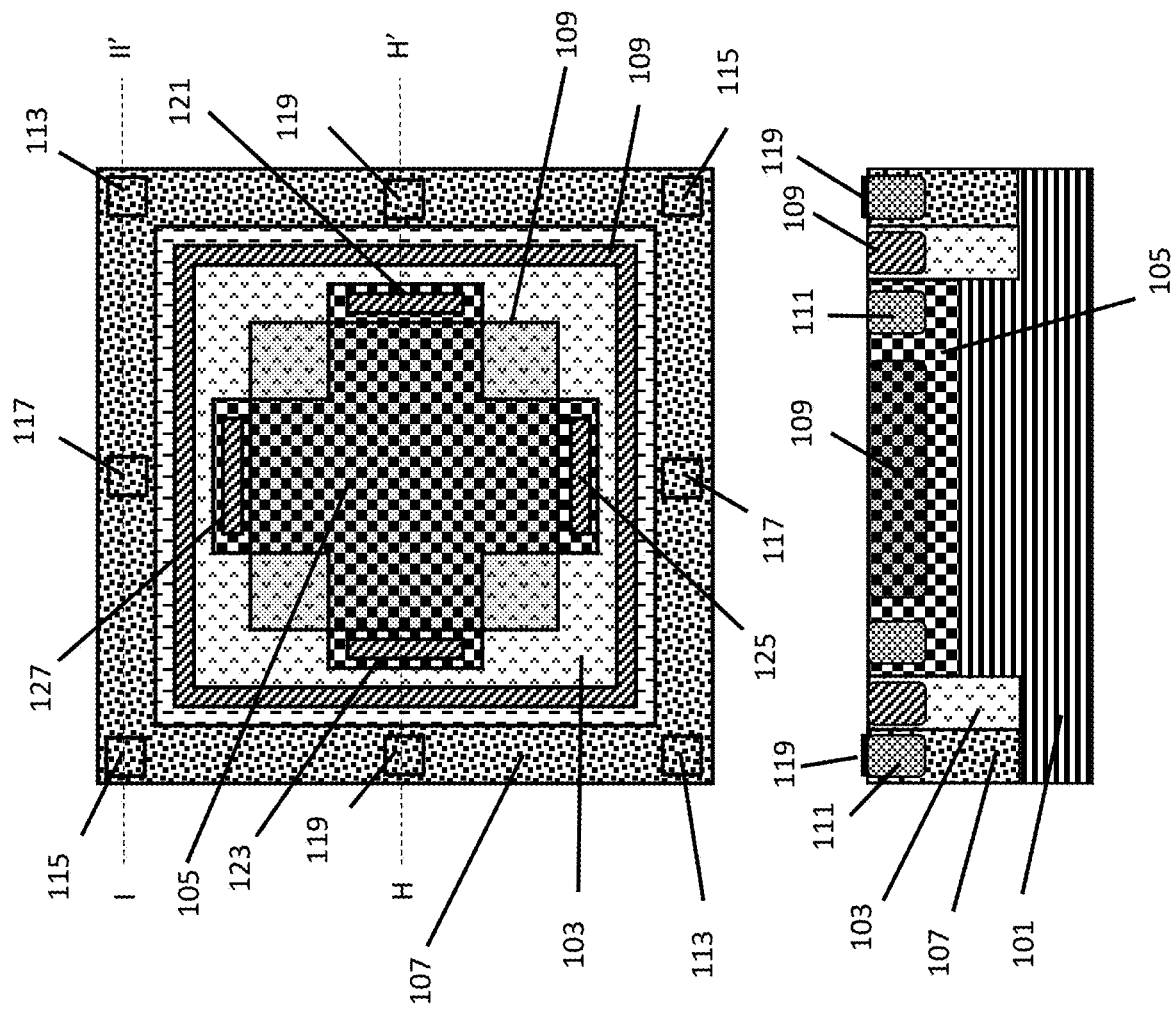

Adverting to FIG. 1G (top view), a p-type dopant 109 is implanted in the p-type well 103 and the first n-type well 105. The p-type dopant 109 is a frame around the n-type well 105 inside n-type well 107 and a square over the cross-shape n-type well 105. In certain examples, the p-type dopant 109 can instead be a different layer that is not the same as p+. It can be a p-layer by itself and another p+ implant can be used for the p-type well 103. Adverting to FIG. 1H, a cross-sectional view of FIG. 1G along line 1H-1H', a n-type dopant 111 is implanted in the n-type well 105 and n-type well 107 near the ends of the cross-shaped n-type well and at corners and between consecutive corners. The implants can be free from existing technology or dedicated. The implanted regions in the n-type well 107 form terminals 113 and 115 at the corners 117 and terminals 119 between consecutive corners. Contacts can be provided on the N+ layer and above it can be metal lines. In certain examples, a substrate contact can be included outside the structure consisting of p+ in PW in the p-type substrate 101. The substrate contact can be another p-well or p-substrate ring surrounding the outer frame.

Figure 1I:
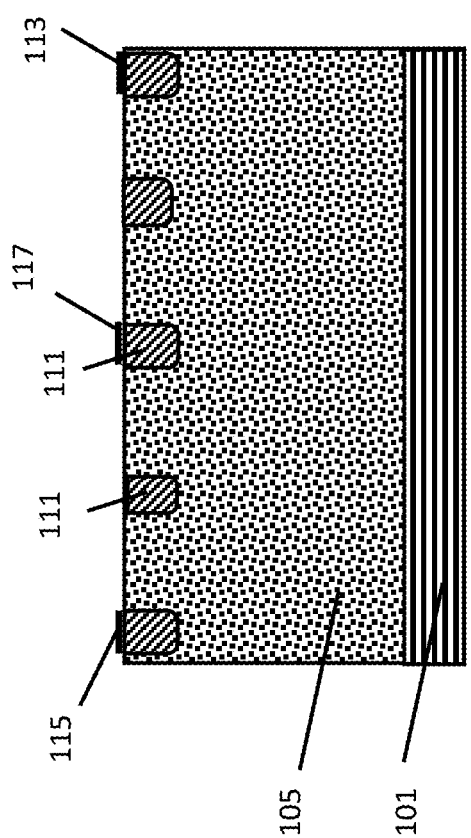

FIG. 1I is a cross-sectional view along line 1I-1I' in FIG. 1G. This view represents a vertical Hall element with voltage traveling from positive terminal 115 to negative terminal 113

The doping concentration in the n-type wells 105 and 107 is 1E16-1E18 $cm^{-3}$. Dopants for the n-type wells include arsenic (As) and phosphorous (P). The doping concentration in the p-type well 103 is 1E16-5E18 $cm^{-3}$ to a depth of 0.5-2

μm. The p-type dopant 109 and n-type dopant 111 have a doping concentration of 1E19-5E20 cm$^{-3}$ to a depth of 0.05-0.3 μm.

Terminals 113 over the n-type well 107 are negative (−) and terminals 115 are positive (+). Regions 117 are Hall voltage sensing terminals for parallel field along H-H' and regions 119 are Hall voltage sensing terminals for parallel field perpendicular to H-H'. Terminal 121 over the n-type well 105 are negative (−) and terminal 123 are positive (+). In other examples, the +ve and −ve terminals can be switched as needed. Hall sensing terminals 125 and 127 are positioned at ends of the cross-shaped n-type well 105. In certain examples, hall sensing terminals 125 and 127 can be exchanged with terminals 121 and 123 to become positive (+) and negative (−) terminals.

As described, the n-type well 105 or n-type well 107 can be formed prior to forming the p-type well 103. Alternatively, the n-type well 105 or the n-type well 107 is formed after the p-type well 103. Further, the p-type dopant 109 and n-type dopant 111 can be implanted before or after the p-type well 103 and n-type wells 105 and 107.

Following the formation of the p-type well 103 and n-type wells 105 and 107, a nitride layer is deposited and patterned to expose selected regions (e.g. all the n+, p+ region except 109 in the center) for silicidation to reduce contact resistance. Then an ILD is deposited and contacts are formed in the ILD and BEOL processing steps can be further performed.

Figure 2A:
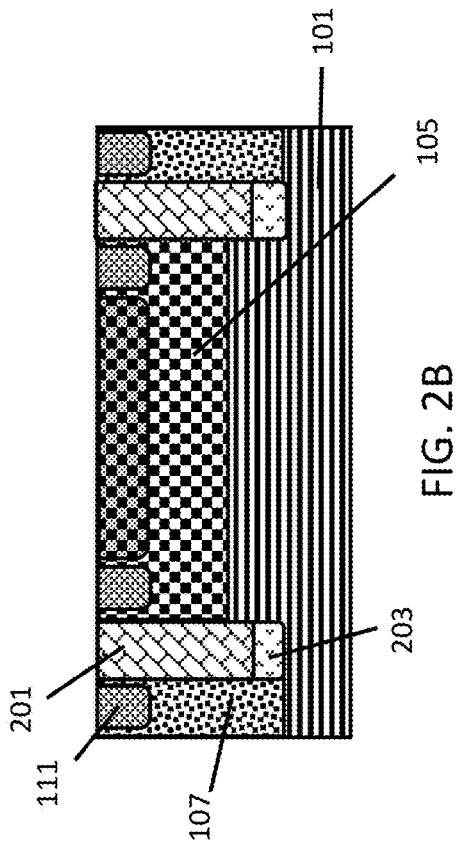
FIGS. 2A through 2D schematically illustrate cross-sectional views of the planar Hall element portion of the 3D Hall element.
Figure 2B:
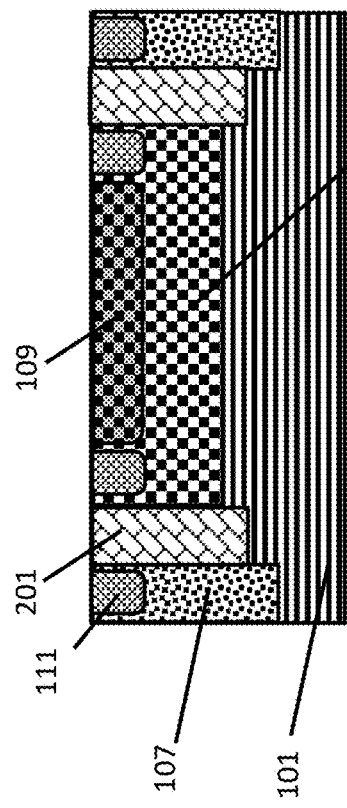
Figure 2C:
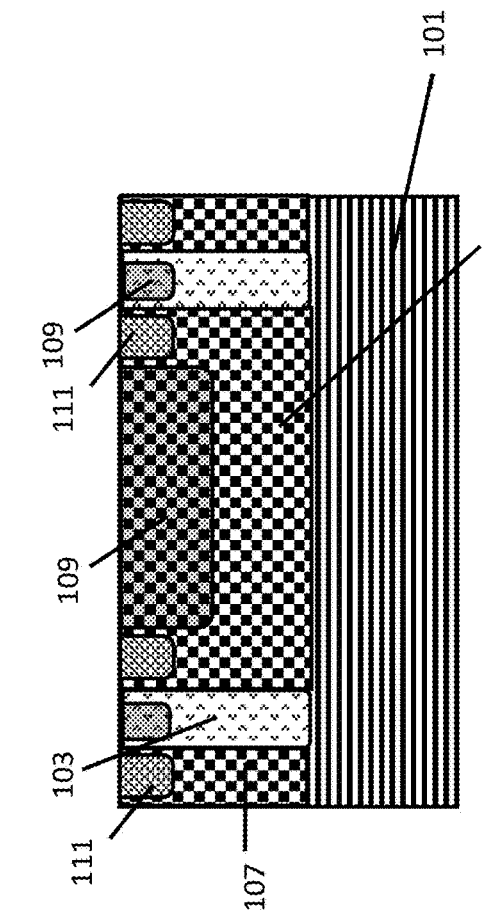
Figure 2D:
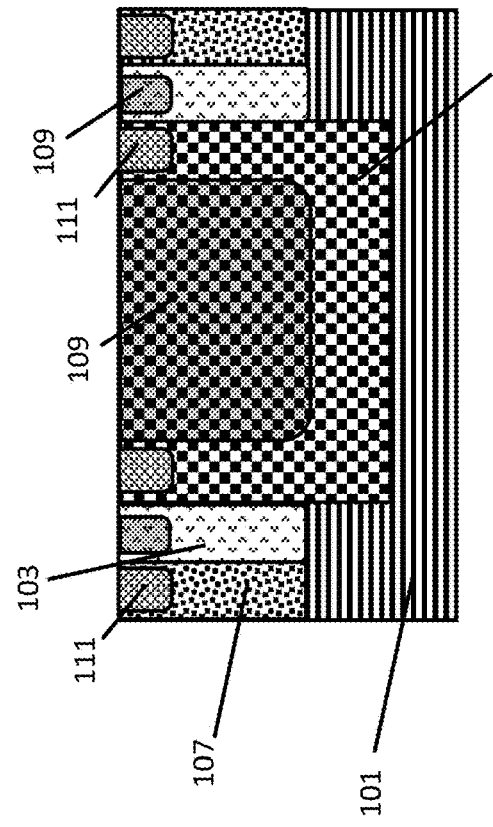

Adverting to FIGS. 2A through 2D, additional structural configurations of the planar Hall element are illustrated in cross-sectional view. STI regions 201 are illustrated in cross-sectional views 2A and 2B. The STI regions are formed to isolate the n-type well 105 and the n-type well 107. In FIG. 2B, the p-type well 203 can be formed under the STI regions 201 to further reduce leakage. In FIG. 2C, the planar thickness can be reduced with a p-type well 103. Other well types can be used instead of p-type. Similarly, in FIG. 2D, the p-type implants 109 can be replaced with other free implants from other devices. It is noted that the p-type implants 109 in the middle will not be the same at the sides. The sides will still use p+ implants. As illustrated in FIG. 2D, a common n-type well can be used for the planar and vertical Hall elements.

Figure 3B:
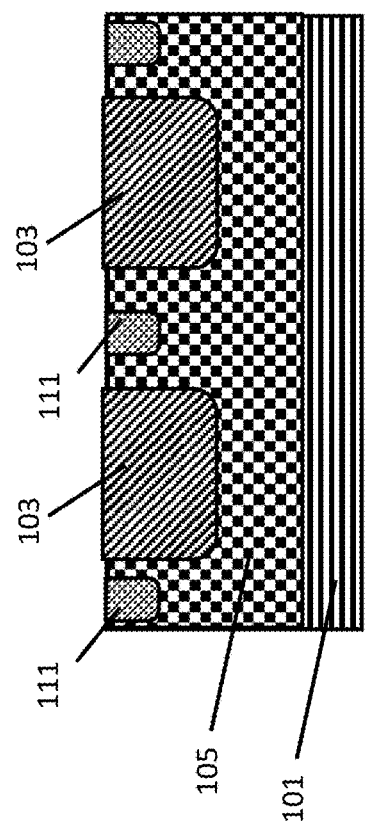
FIGS. 3A through 3D schematically illustrate cross-sectional views of the vertical Hall element portion of the 3D Hall element.
Figure 3D:
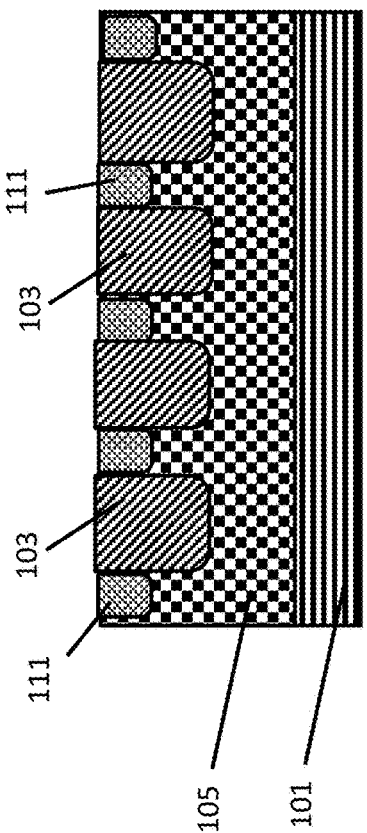
Figure 3A:
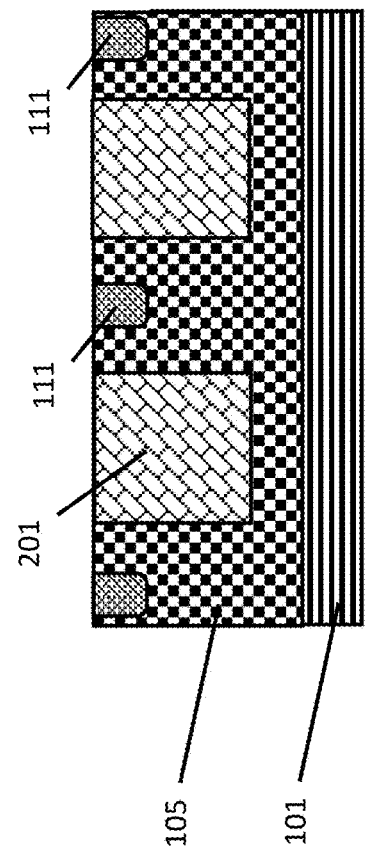
Figure 3C:
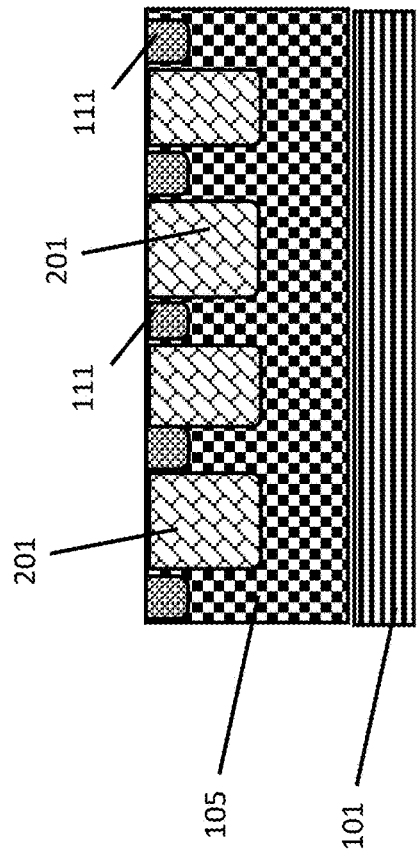

Adverting to FIGS. 3A through 3D, additional structural configurations of the vertical Hall element are illustrated in cross-sectional view. In FIG. 3A, the STI regions 201 are formed as ½ cross-plate. In FIG. 3B, the p-type wells 103 are formed as ½ cross-plate. In FIG. 3C, the STI regions 201 are formed as 2×½ cross-plate. In FIG. 3D, the p-type wells 103 are formed as 2×½ cross-plate.

The embodiments of the present disclosure can achieve several technical effects, including providing a Hall element for sensing in a single concentrated region with reduced cross-interference with separate sensing for each magnetic field component. Another technical effect includes the individual optimization of vertical and planar Hall elements.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using Hall effect sensors. The present disclosure is particularly applicable in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed:

1. A device comprising:
   a p-type well formed in a substrate;
   a first n-type well formed in a first region surrounded by the p-type well in top view;
   a second n-type well formed in a second region surrounding the p-type well;
   an n-type dopant region in the first n-type well and the second n-type well, respectively; and
   a p-type dopant region in the p-type well and the first n-type well, respectively,
   wherein the first n-type well formed in the first region has a cross-shaped pattern in top view,
   wherein the second n-type well formed in the second region has a frame-shaped pattern in top view, and
   wherein the p-type well completely and continuously surrounds the cross-shaped first n-type well in top view.

2. The device according to claim 1, wherein the substrate comprises a p-type substrate.

3. The device according to claim 1, further comprising:
   shallow trench isolation (STI) regions adjacent to p-type well.

4. A three dimensional Hall effect sensor comprising:
   a p-type well formed in a substrate;
   a first n-type well formed in a first region surrounded by the p-type well in top view;
   a second n-type well formed in a second region surrounding the p-type well;
   an n-type dopant region in the first n-type well and the second n-type well, respectively; and
   a p-type dopant region in the p-type well and the first n-type well, respectively,
   wherein the first n-type well is formed in the first region as a cross-shaped pattern in top view
   wherein the second n-type well is formed in the second region as a frame-shaped pattern in top view, and
   wherein the p-type well completely and continuously surrounds the cross-shaped n-type well in top view.

5. The three dimensional Hall effect sensor according to claim 4, wherein the substrate comprises a p-type substrate.

6. The three dimensional Hall effect sensor according to claim 4, further comprising:
   shallow trench isolation regions formed adjacent to p-type well.

7. The three dimensional Hall effect sensor according to claim 4, wherein the first n-type well or the second n-type well are formed prior the p-type well.

8. The three dimensional Hall effect sensor according to claim 4, wherein the first n-type well or the second n-type well are formed after the p-type well.

9. The three dimensional Hall effect sensor according to claim 4, wherein the n-type dopant region and the p-type dopant region are respectively formed before the first n-type well and the second n-type well and the p-type well.

10. The three dimensional Hall effect sensor according to claim 4, comprising the n-type dopant region and the p-type dopant region are respectively formed after the first n-type well and the second n-type well and the p-type well.

11. The three dimensional Hall effect sensor according to claim 4, further comprising:
a patterned nitride layer exposing selected regions;
self-aligned silicidation formed in the selected regions for reducing resistance in each respective first n-type well, the second n-type well and the p-type well; and
an interlayer dielectric (ILD) formed over each respective first n-type well, the second n-type well and the p-type well.

12. The three dimensional Hall effect sensor according to claim 11, further comprising:
contacts formed in the ILD.

* * * * *